United States Patent
Shinohara

(10) Patent No.: US 10,608,643 B2
(45) Date of Patent: Mar. 31, 2020

(54) SEMICONDUCTOR DEVICE INCLUDING INTEGRATED CIRCUIT OF FLIP-FLOPS AND SWITCHES

(71) Applicants: Kabushiki Kaisha Toshiba, Minato-ku, Tokyo (JP); Toshiba Electronic Devices & Storage Corporation, Minato-ku, Tokyo (JP)

(72) Inventor: Koji Shinohara, Oita Oita (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 15/919,761

(22) Filed: Mar. 13, 2018

(65) Prior Publication Data
US 2019/0074839 A1 Mar. 7, 2019

(30) Foreign Application Priority Data
Sep. 5, 2017 (JP) .................. 2017-170045

(51) Int. Cl.
| | | |
|---|---|---|
| H03K 21/10 | (2006.01) | |
| H01L 21/82 | (2006.01) | |
| H01L 23/52 | (2006.01) | |
| H01L 21/8238 | (2006.01) | |
| H01L 21/66 | (2006.01) | |
| H01L 21/768 | (2006.01) | |
| H03K 21/40 | (2006.01) | |

(Continued)

(52) U.S. Cl.
CPC ....... *H03K 21/10* (2013.01); *H01L 21/76892* (2013.01); *H01L 21/76894* (2013.01); *H01L 21/78* (2013.01); *H01L 21/823871* (2013.01); *H01L 22/14* (2013.01); *H01L 22/20* (2013.01); *H01L 23/528* (2013.01); *H01L 27/092* (2013.01); *H03K 21/40* (2013.01); *H01L 22/32* (2013.01)

(58) Field of Classification Search
CPC .. H03K 21/10; H03K 21/40; H01L 21/76892; H01L 21/76894; H01L 21/78; H01L 21/823871; H01L 22/14; H01L 23/528; H01L 27/092
USPC .......................................... 257/369; 438/199
See application file for complete search history.

(56) References Cited

U.S. PATENT DOCUMENTS 4,764,926 A * 8/1988 Knight ........... G01R 31/318558
  714/726
5,130,568 A * 7/1992 Miller .................. H03K 3/0375
  324/750.3

FOREIGN PATENT DOCUMENTS

| JP | H8-186486 A | 7/1996 |
|---|---|---|
| JP | H11-312972 A | 11/1999 |
| JP | 2008-196917 A | 8/2008 |

* cited by examiner

*Primary Examiner* — Didarul A Mazumder
(74) *Attorney, Agent, or Firm* — White & Case LLP

(57) ABSTRACT

A method for manufacturing a semiconductor device includes forming a circuit including a plurality of flip-flops, a plurality of first switches, a second switch and a signal line on a wafer, the flip-flops being connected in series through the first switches, respectively, and the signal line being connected to the second switch, and being configured to supply a signal in parallel to the flip-flops; testing the flip-flops by turning off the first switches, turning on the second switch, and supplying a test signal in parallel through the signal line to the flip-flops; and cutting at least one interconnect of a switch portion in the circuit, the switch (Continued)

portion including the first switches and the second switch, so that the first switch is turned on and the second switch is turned off.

9 Claims, 7 Drawing Sheets

(51) Int. Cl.
*H01L 27/092* (2006.01)
*H01L 23/528* (2006.01)
*H01L 21/78* (2006.01)

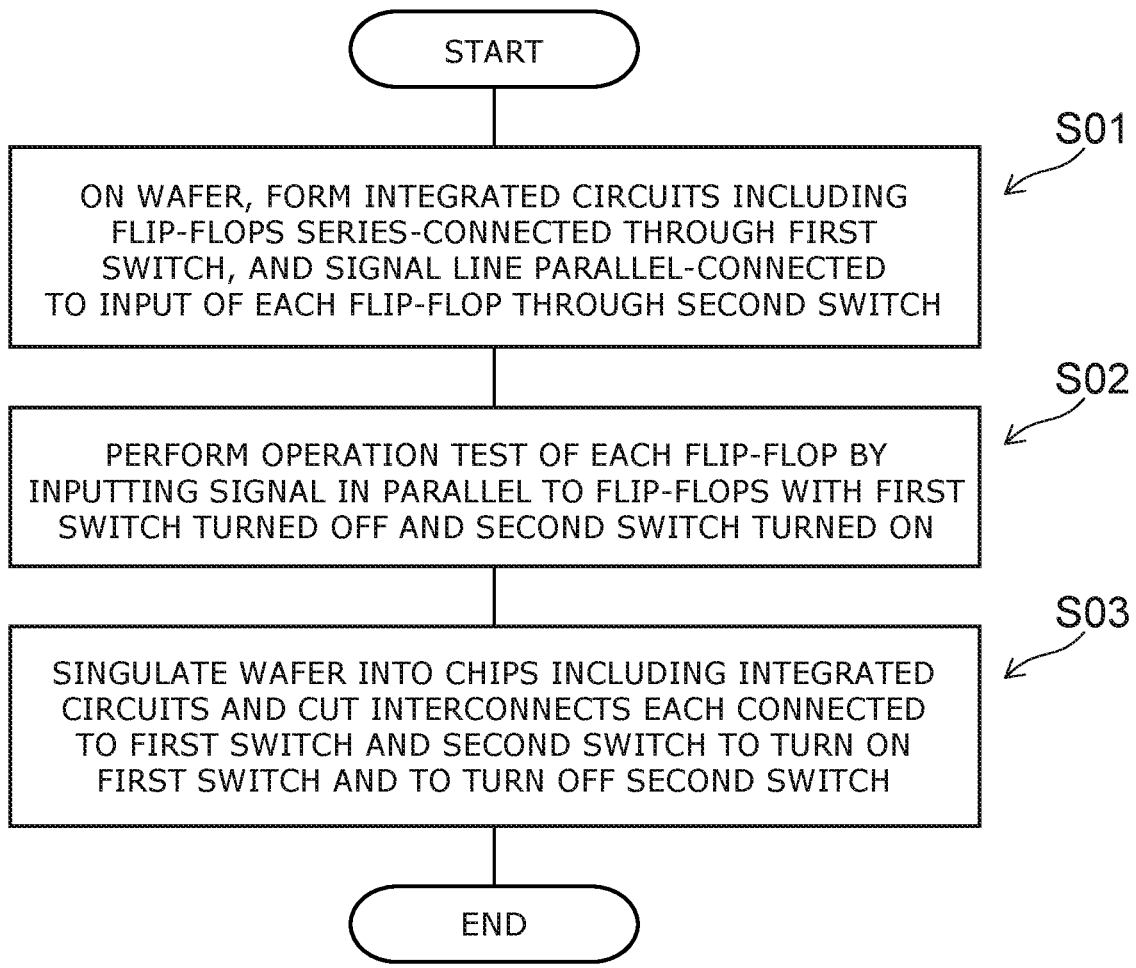

US 10,608,643 B2

SEMICONDUCTOR DEVICE INCLUDING INTEGRATED CIRCUIT OF FLIP-FLOPS AND SWITCHES

CROSS-REFERENCE TO RELATED APPLICATIONS

This application is based upon and claims the benefit of priority from Japanese Patent Application No. 2017-170045, filed on Sep. 5, 2017; the entire contents of which are incorporated herein by reference.

FIELD

Embodiments generally relate to a semiconductor device and a method for manufacturing the same.

BACKGROUND

A circuit such as a counter circuit has a configuration in which a plurality of flip-flops are connected in series. Each flip-flop is sequentially operated from the initial stage in the operation test of this circuit. Thus, it takes a long test time to verify the operation of all the flip-flops.

BRIEF DESCRIPTION OF THE DRAWINGS

FIG. 5 is a flow chart showing a manufacturing method of the semiconductor device according to the embodiment;

DETAILED DESCRIPTION

Figure 1:
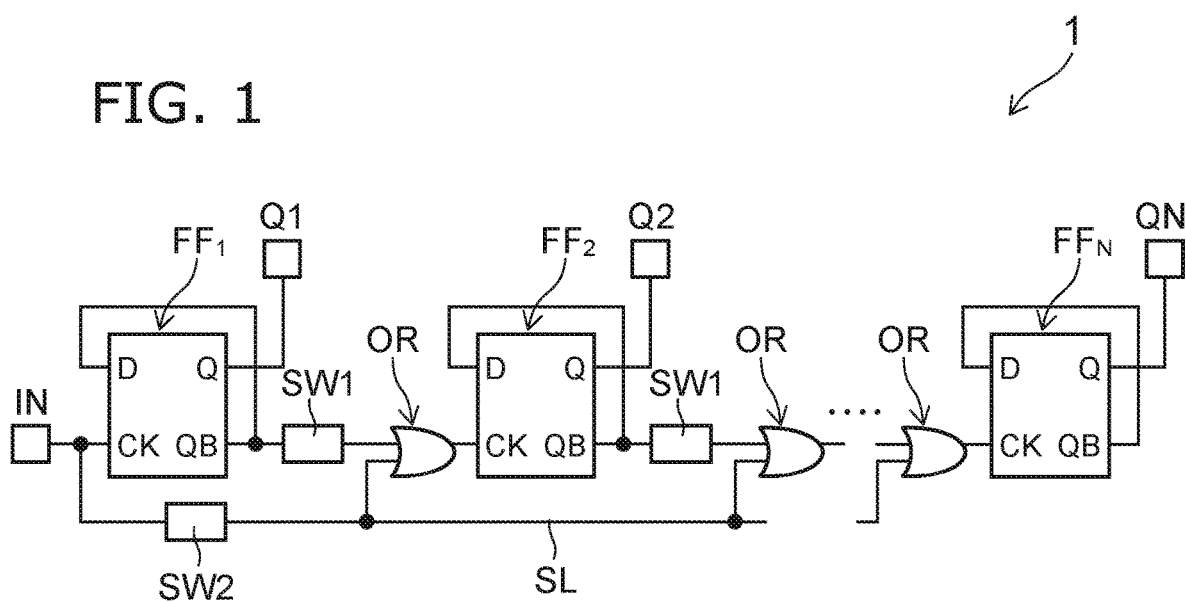
FIG. 1 is a block diagram showing a circuit configuration of a semiconductor device according to an embodiment.

According to one embodiment, a method for manufacturing a semiconductor device includes forming a circuit including a plurality of flip-flops, a plurality of first switches, a second switch and a signal line on a wafer, the flip-flops being connected in series through the first switches, respectively, and the signal line being connected to the second switch, and being configured to supply a signal in parallel to the flip-flops; testing the flip-flops by turning off the first switches, turning on the second switch, and supplying a test signal in parallel through the signal line to the flip-flops; and cutting at least one interconnect of a switch portion in the circuit, the switch portion including the first switches and the second switch, so that the first switches are turned on and the second switch is turned off.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

FIG. 1 is a block diagram showing a circuit configuration of a semiconductor device according to an embodiment. A circuit shown in FIG. 1 is e.g. an asynchronous counter circuit 1. The circuit has a configuration in which flip-flops $FF_1$-$FF_N$ (N: an integer of two or more) are connected in series. Each flip-flop FF has a data input D, a clock input CK, an output Q, and an inverted output QB. The flip-flop FF has a configuration in which the inverted output QB is fed back to the data input D. In the following description, there is a case where the flip-flops $FF_1$-$FF_N$ are described individually, or collectively referred to as "flip-flop FF".

As shown in FIG. 1, a switch SW1 and a logical sum gate OR are each placed between the flip-flop $FF_{P-1}$ and the flip-flop $FF_P$ (P: an integer of two or more and N or less). The input of the switch SW1 is connected to the inverted output QB of the flip-flop FF. The output of the switch SW1 is connected to the input of the logical sum gate OR. The output of the logical sum gate OR is connected to the clock input CK of the flip-flop FF.

The counter circuit 1 further includes a signal line SL connected in parallel to the input of each logical sum gate OR. A signal supplied to the clock input CK of the first stage flip-flop $FF_1$ is also supplied in parallel by the signal line SL to each clock input CK of the flip-flops $FF_2$-$FF_N$ through a switch SW2.

Figure 2A:
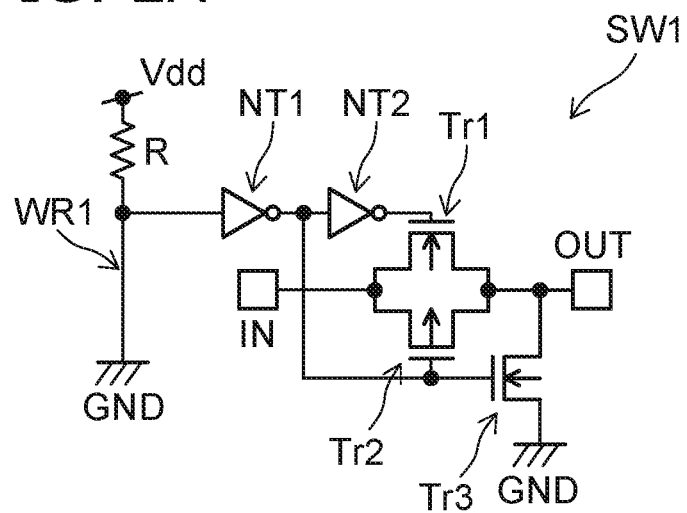
FIGS. 2A and 2B are circuit diagrams showing a switch circuit according to the embodiment.
Figure 2B:
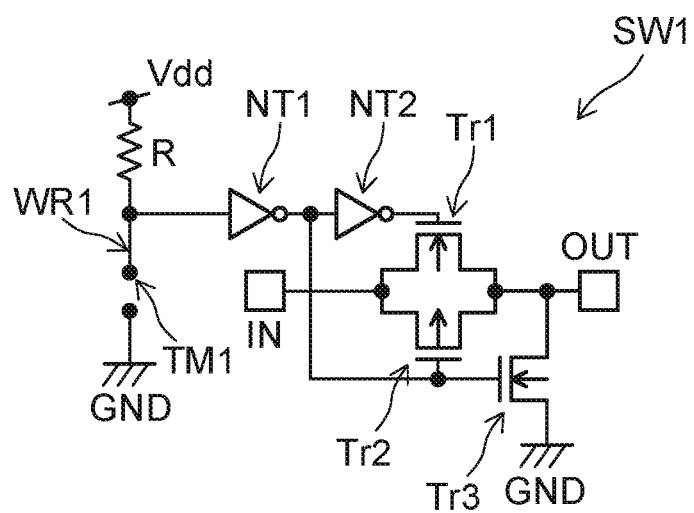

FIGS. 2A and 2B are circuit diagrams showing the switch circuit SW1. FIG. 2A is a circuit diagram showing the switch SW1 provided on a wafer. FIG. 2B is a circuit diagram showing the switch SW1 included in a semiconductor device after being divided into chips.

As shown in FIG. 2A, the switch SW1 includes transistors Tr1-Tr3, inverters NT1 and NT2. The transistors Tr1 and Tr3 are e.g. N-channel MOS (hereinafter NMOS) transistors. The transistor Tr2 is e.g. a P-channel MOS (hereinafter PMOS) transistor.

The input (IN) of the switch SW1 is connected to the drains of the transistors Tr1 and Tr2, for example. The output (OUT) of the switch SW1 is connected to the sources of the transistors Tr1 and Tr2, for example. The output of the switch SW1 is grounded through the transistor Tr3. That is, the transistor Tr3 has the drain connected to the output of the switch SW1, and the source of ground potential.

A gate potential is supplied to the gate of the transistor Tr1 through the inverters NT1 and NT2. The gate potential is also supplied to each gate of the transistors Tr2 and Tr3 through the inverter NT1.

As shown in FIG. 2A, the power supply line Vdd is grounded through a resistor R. A potential on the GND side of the resistor R is inputted to the inverter NT1. Thus, the potential Low is inputted to the inverter NT1. Accordingly, the output potential of the inverter NT1 is High, and supplied to each gate of the transistors Tr2 and Tr3. Thus, the transistor Tr2 is turned to the OFF state, and the transistor Tr3 is turned to the ON state. On the other hand, the output potential High of the inverter NT1 is inputted to the inverter NT2. Thus, the output potential of the inverter NT2 is Low, and inputted to the gate of the transistor Tr1. Thus, the transistor Tr1 is turned to the OFF state.

Thus, in the wafer state, the input/output path of the switch SW1 is turned OFF. The output of the switch SW1 is placed at the GND potential, i.e. Low.

In the example shown in FIG. 2B, the interconnect WR1 between the resistor R and GND is cut such that a part of the interconnect WR1 on the resistor R side is connected to the input of the inverter NT1. The interconnect WR1 connected to the input of the inverter NT1 includes a cut end TM1 on the resistor R side.

As described later, the interconnect WR1 is cut in the process for forming the semiconductor device chip. Thus, in the semiconductor device after being diced, the potential High of the power supply line Vdd is inputted to the inverter NT1 through the resistor R. Accordingly, the output potential of the inverter NT1 is Low, and supplied to each gate of the transistors Tr2 and Tr3. Then, the transistor Tr2 is turned to the ON state, and the transistor Tr3 is turned to the OFF state. Moreover, the output potential of the inverter NT2 is High, and supplied to the gate of the transistor Tr1. Then, the transistor Tr1 is turned to the ON state. As a result, in the semiconductor device after being diced, the input/output path of the switch SW1 is in the ON state.

Figure 3A:
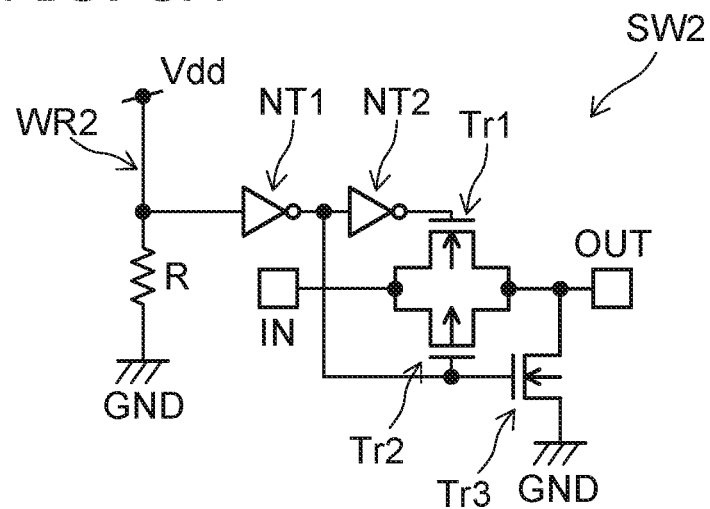
FIGS. 3A and 3B are circuit diagrams showing another switch circuit according to the embodiment.
Figure 3B:
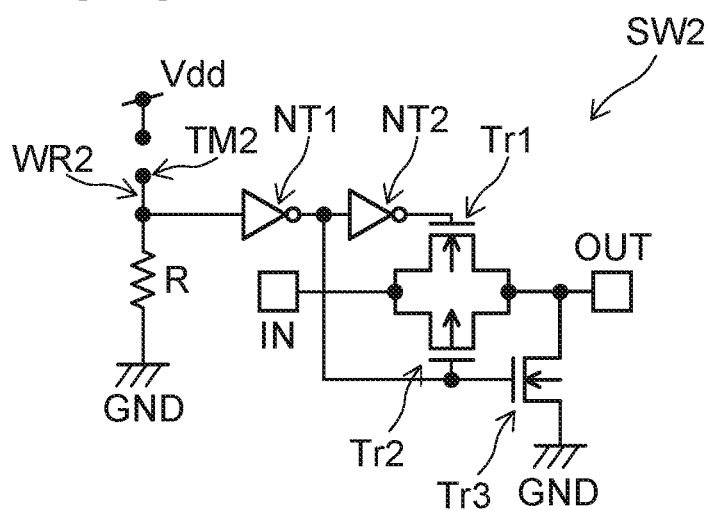

FIGS. 3A and 3B are circuit diagrams showing the switch SW2. FIG. 3A is a circuit diagram showing the switch SW2 provided on a wafer. FIG. 3B is a circuit diagram showing the switch SW2 included in a semiconductor device after being diced.

As shown in FIGS. 3A and 3B, the switch SW2 includes transistors Tr1-Tr3, inverters NT1 and NT2. The switch SW2 is different from the switch SW1 shown in FIG. 2A in that the input of the inverter NT1 is connected to Vdd side of the resistor R.

As shown in FIG. 3A, the potential High of the power supply line Vdd is inputted to the inverter NT1 of the switch SW2. Thus, the output potential of the inverter NT1 is Low, and supplied to each gate of the transistors Tr2 and Tr3. Then, the transistor Tr2 is turned to the ON state, and the transistor Tr3 is turned to the OFF state. Moreover, the output potential of the inverter NT2 is High, and supplied to the gate of the transistor Tr1. Then, the transistor Tr1 is turned to the ON state. As a result, in the wafer state, the switch SW2 is in the ON state.

As shown in FIG. 3B, the interconnect WR2 is cut between the power supply line Vdd and the resistor R. A part of the interconnect WR2 on the resistor R side is connected to the input of the inverter NT1. The part of the interconnect WR2 connected to the input of the inverter NT1 includes an end TM2 on the resistor side.

The interconnect WR2 is also cut in the process of forming the semiconductor device chip. In the semiconductor device after being diced, the potential Low of GND is inputted to the inverter NT1 of the switch SW2 through the resistor R. Accordingly, the output potential of the inverter NT1 is High, and supplied to each gate of the transistors Tr2 and Tr3. Then, the transistor Tr2 is turned to the OFF state, and the transistor Tr3 is turned to the ON state. The output of the switch SW2 is the GND potential, i.e. Low.

On the other hand, the output potential of the inverter NT2 is Low, and supplied to the gate of the transistor Tr1. Then, the transistor Tr1 is turned to the OFF state. As a result, in the semiconductor device after being diced, the input/output path of the switch SW2 is in the OFF state. The output of the switch SW2 is Low.

Figure 4A:
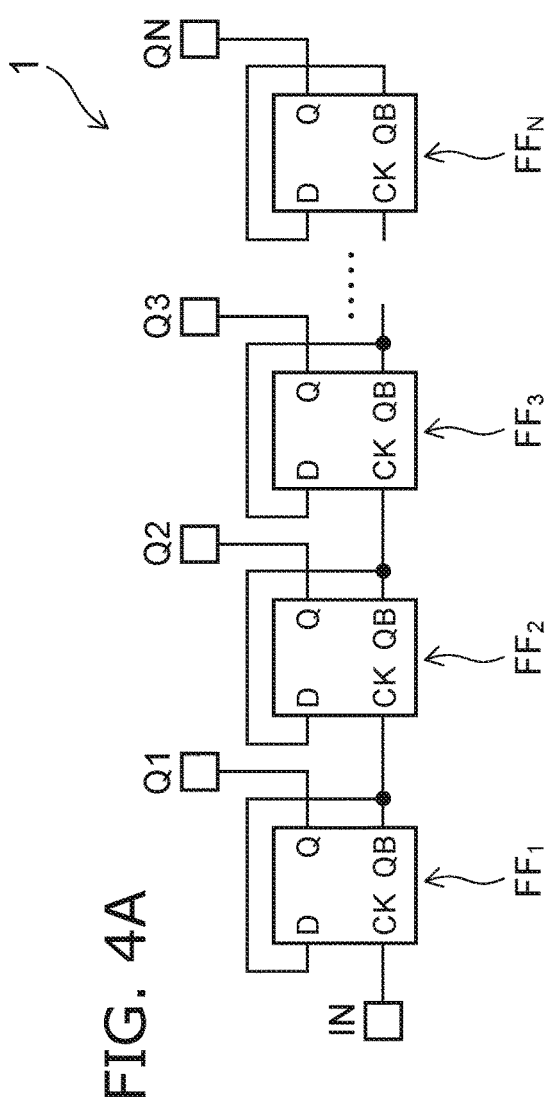
FIGS. 4A and 4B are schematic diagrams showing a circuit operation according to the embodiment.
Figure 4B:
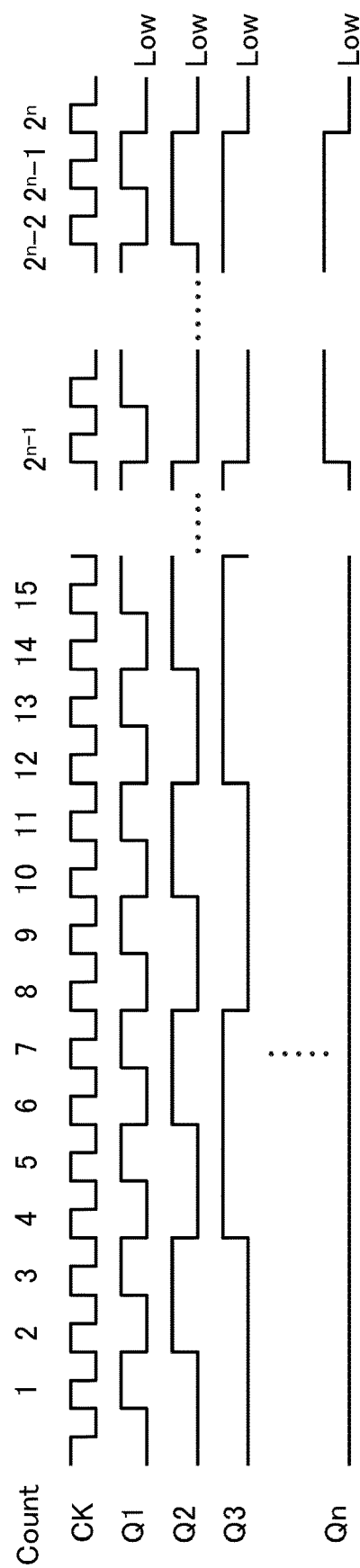

FIGS. 4A and 4B are schematic diagrams showing an operation of the counter circuit 1. FIG. 4A is a block diagram showing the configuration of the counter circuit 1 included in the semiconductor device after being diced. FIG. 4B is a time chart showing the operation of the counter circuit 1.

As described above, in the semiconductor device after being diced, the switch SW1 is in the ON state, and the switch SW2 is in the OFF state. The output of the switch SW2 is Low, and the input from the signal line SL to the logical sum gate OR is constantly Low. Thus, as shown in FIG. 4A, the counter circuit 1 may be considered to operate in the configuration in which the switches SW1, SW2, the logical sum gate OR, and the signal line SL are omitted.

FIG. 4B shows a clock signal supplied to the clock input CK of flip-flop $FF_1$ at the first stage, and outputs Q1, Q2, Q3, QN of the flip-flops $FF_1$, $FF_2$, $FF_3$, $FF_N$. Each flip-flop FF detects e.g. the rising from Low to High of the clock signal supplied to the clock input CK, and inverts the output thereof.

As shown in FIG. 4B, at the rising timing of count 1 of the clock signal, the flip-flop $FF_1$ at the first stage inverts the output Q1 thereof from Low to High. Then, the inverted output QB of the flip-flop $FF_1$ is Low. Thus, the clock input CK of the second stage flip-flop $FF_2$ is Low, and the output Q2 thereof is held Low.

Subsequently, at the rising timing of count 2 of the clock signal, the flip-flop $FF_1$ inverts the output Q1 thereof from High to Low. At this time, the inverted output QB of the flip-flop $FF_1$ is turned to High and inputted to the clock input CK of the flip-flop $FF_2$ at the second stage. Then, the output Q2 of the flip-flop $FF_2$ is inverted from Low to High. The inverted output QB of the flip-flop $FF_2$ is Low. The output Q3 of the flip-flop $FF_3$ at the third stage is held Low.

Subsequently, at the rising timing of count 3 of the clock signal, the flip-flop $FF_1$ at the initial stage inverts the output Q1 thereof from Low to High. Then, the inverted output QB of the flip-flop $FF_1$ is inverted from High to Low. However, the output Q2 of the flip-flop $FF_2$ at the second stage is held High. Thus, the inverted output QB of the flip-flop $FF_2$ is Low. The output Q3 of the third stage flip-flop $FF_3$ is held Low.

Subsequently, at the rising timing of count 4 of the clock signal, the flip-flop $FF_1$ at the initial stage inverts the output Q1 thereof from High to Low. Then, the inverted output QB of the flip-flop $FF_1$ is inverted from Low to High. The output Q2 of the flip-flop $FF_2$ at the second stage is inverted from High to Low. The inverted output QB of the flip-flop $FF_2$ is inverted from Low to High. According to the inverted output QB of the flip-flop $FF_2$, the output Q3 of the flip-flop $FF_3$ at the third stage is inverted from Low to High.

Thus, the outputs Q of the flip-flops $FF_1$-$FF_N$ are sequentially inverted from Low to High. The timing of inverting the output Q of the n-th stage flip-flop FF is $2^{n-1} \times Tc$ seconds later. Here, Tc (seconds) is the clock cycle. For instance, the output Q of the last stage flip-flop $FF_N$ is inverted at the timing of $2^{N-1} \times Tc$ seconds later after the first clock count 1 is inputted. Furthermore, it requires $2^N-1$ clock counts until the outputs of all the flip-flops FF are inverted from Low to High, and all the output states are verified, which complete at $(2^N-1) \times Tc$ seconds later.

For instance, when the counter circuit having the configuration shown in FIG. 4A is formed on a wafer in place of the counter circuit 1 shown in FIG. 1, the time required to complete the operation test becomes longer as the number of stages increases in the flip-flops FF connected in series. Thus, it takes a longer time in an operation test of the semiconductor device in the wafer state to check the counter circuit. As a result, the throughput time of the manufacturing process may increase significantly.

In contrast, in the counter circuit 1 according to this embodiment, the switch SW1 is placed to operate each flip-flop FF independently. Thus, the clock signal can be inputted in parallel to the clock input CK of each flip-flop through the signal line SL. Accordingly, the operation test can be completed in a short time irrespective of the number of stages of flip-flops FF.

Furthermore, the interconnects WR1 and WR2 of the switches SW1 and SW2 are cut in the semiconductor device after being diced. Thus, the switch SW1 is turned to the ON state, and the switch SW2 is turned to the OFF state. Thereby, it is possible to achieve the operation similar to that of the simplified circuit shown in FIG. 4A.

Figure 6A:
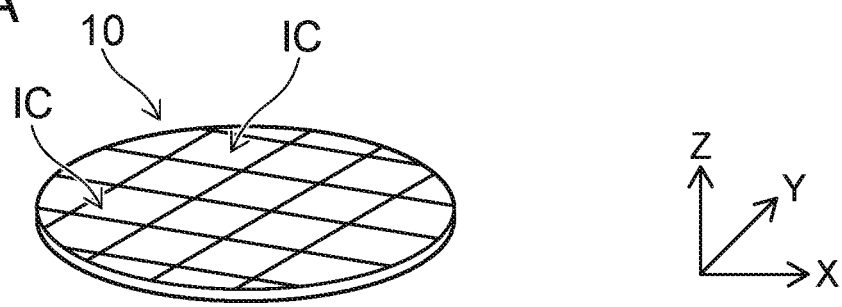
FIGS. 6A to 6C are schematic views showing the manufacturing method of the semiconductor device according to the embodiment.

Next, a manufacturing method of the semiconductor device according to the embodiment is described with reference to FIGS. 5 to 6C. FIG. 5 is a flow chart showing a method for manufacturing the semiconductor device according to the embodiment. FIGS. 6A to 6C are schematic views showing the method for manufacturing the semiconductor device according to the embodiment.

Step S01: An integrated circuit IC including a plurality of flip-flops FF is formed on a wafer 10. As shown in FIG. 6A, the integrated circuits IC are arranged with a constant pitch in the X-direction and the Y-direction on the front surface of the wafer 10. Each integrated circuit IC includes a plurality of flip-flops FF, switches SW1, SW2, a signal line SL, and a logical sum gate OR (see FIG. 1).

The plurality of flip-flops FF are connected in series via the switch SW1 and the logical sum gate OR. The inverted output QB of each flip-flop FF is inputted to the switch SW1 placed between each flip-flop FF and the flip-flop FF at the next stage. The output of the switch SW1 is connected to the input of the logical sum gate OR. The output of the logical sum gate OR is connected to the clock input CK of the flip-flop FF at the next stage. A clock signal is inputted by the signal line SL through the switch SW2. The signal line SL is connected to the input of each logical sum gate OR. The signal line SL supplies the clock signal in parallel through the logical sum gate OR to the clock input CK of each flip-flop FF.

The integrated circuit IC1 includes interconnects WR1 and WR2 of the switches SW1 and SW2 (see FIGS. 2 and 3). As shown in FIG. 6B, parts of the interconnects WR1 and WR2 is provided in a space 13 between the integrated circuit IC1 and an integrated circuit IC2 adjacent thereto.

Step S02: The operation test of each integrated circuit IC is performed in the wafer state. At this time, the switch SW1 is in the OFF state, and the switch SW2 is in the ON state. A clock signal is inputted to the terminal connected to the clock input CK of the initial stage flip-flop FF1 to check inversion of the output Q of each flip-flop FF. The clock signal is also supplied in parallel to the flip-flops FF of the second and subsequent stages through the switch SW2, the signal line SL, and the logical sum gate OR.

Step S03: The wafer 10 is divided into chips each including the integrated circuit IC. For instance, a dicing saw is used to cut the wafer 10 along the space 13 between the adjacent integrated circuits IC. Thereby, each semiconductor device is diced into chip. At this time, as shown in FIG. 6C, parts of the interconnects WR1 and WR2 are cut in the switches SW1 and SW2. The ends TM1 and TM2 of the interconnects of the switches SW1 and SW2 are exposed at the outer edge of each integrated circuit IC diced into chip.

The dicing process of the integrated circuit IC is not limited to the above method. For instance, the wafer 10 may be divided using a dicing saw or a scriber after the part of the space 13 exposed in the wafer 10 is selectively etched. In this case, the interconnects WR1 and WR2 are cut by the etching in the wafer 10.

In the embodiment, it is possible to reduce the time required to complete the operation test, in the wafer state, of the flip-flops FF connected in series. Furthermore, the switches SW1 and SW2 can be turned to the ON state and the OFF state, respectively, and thus, the flip-flops FF can operate as intended after being diced without an additional step for cutting the interconnects WR1 and WR2. The integrated circuit IC includes both cut ends of the interconnects WR1 and WR2, and the end surfaces thereof are placed at the outer edge of the integrated circuit IC.

Figure 7A:
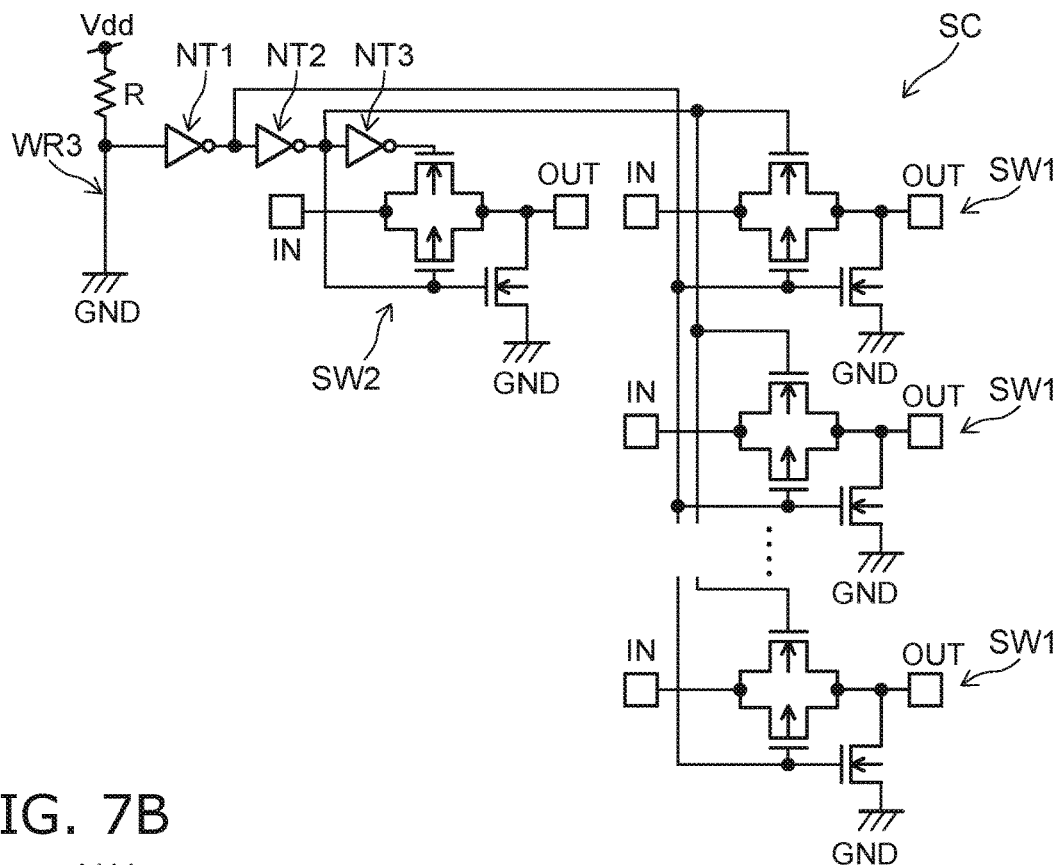
FIGS. 7A and 7B are circuit diagrams showing a switch circuit according to a variation of the embodiment.
Figure 7B:
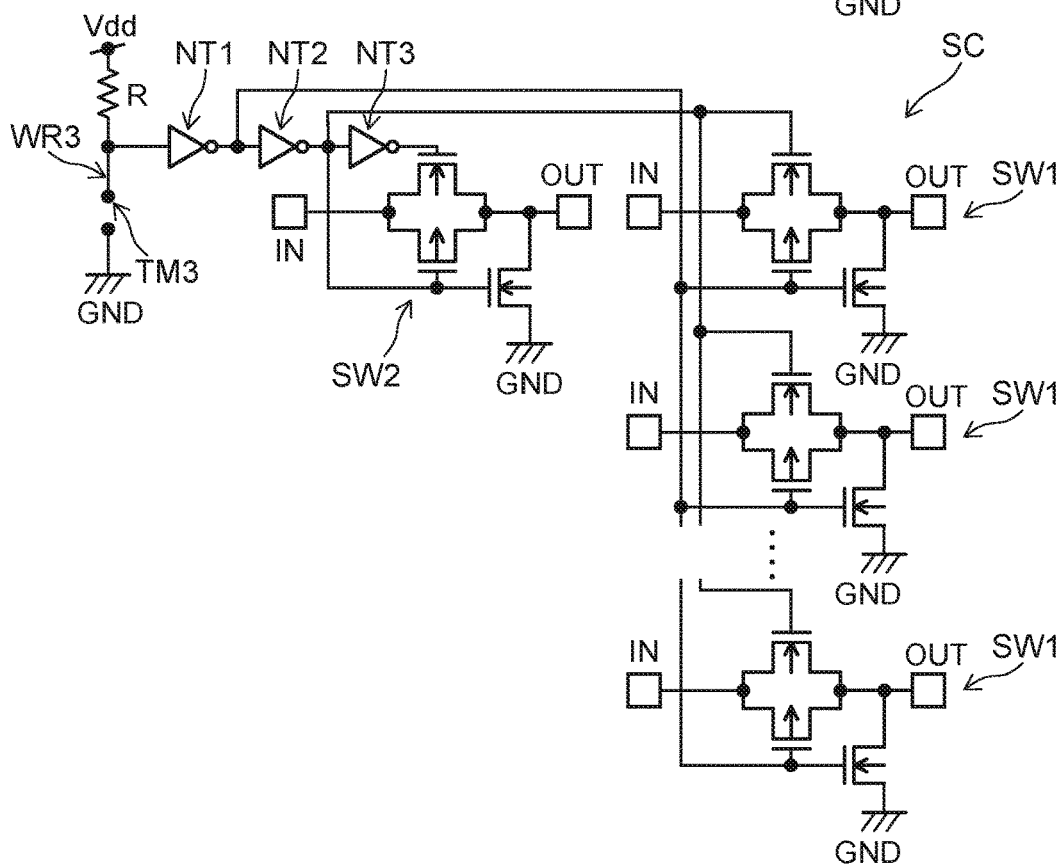

FIGS. 7A and 7B are circuit diagrams showing a switch circuit SC according to a variation of the embodiment. FIG. 7A is the circuit diagram showing the switch circuit SC in a wafer state. FIG. 7B is the circuit diagram showing the switch circuit SC included in a semiconductor device after being diced.

As shown in FIG. 7A, the switch circuit SC includes a plurality of switches SW1 and a switch SW2. The switches SW1 are placed respectively between flip-flops connected in series. The switch SW2 is placed between a terminal connected to the clock input CK of the flip-flop $FF_1$ at the initial stage and a signal line SL.

A gate bias is supplied from a power supply line Vdd through inverters NT1, NT2, and NT3 to the gates of transistors Tr1, Tr2, and Tr3 included in the switches SW1 and SW2 (see FIGS. 2 and 3).

As shown in FIG. 7A, potential Low is inputted from the power supply line Vdd side to the inverter NT1. The output potential High of the inverter NT1 is supplied to the gate of the transistors Tr2 and Tr3 of each switch SW1. Furthermore, according to the output of the inverter NT1, the inverter NT2 outputs potential Low. The output of the inverter NT2 is supplied to the transistor Tr1 of each switch SW1. Thus, each switch SW1 is turned to the OFF state, and the output potential thereof is Low.

Furthermore, the output of the inverter NT2 is inputted to the inverter NT3. The inverter NT3 outputs potential High. The output of the inverter NT3 is supplied to the gate of the transistor Tr1 of the switch SW2 and turns the transistor Tr1 to the ON state. On the other hand, the output potential Low of the inverter NT2 is supplied to each gate of the transistors Tr2 and Tr3 of the switch SW2. Thus, the transistor Tr2 is turned to the ON state, and the transistor Tr3 is turned to the OFF state. As a result, the test operation mode of the wafer state is achieved in the counter circuit shown in FIG. 1.

As shown in FIG. 7B, the semiconductor device after being diced includes an interconnect WR3 connected to the input of the inverter NT1. The interconnect WR3 is connected between a resistor R and GND. The interconnect WR3 is cut in the semiconductor device after being diced. A part of the interconnect WR3 after cutting includes an end TM3, and is connected to the input of the inverter NT1. A potential High of the power supply line Vdd is supplied to the inverter NT1 after the interconnect WR3 is cut. Thus, the output of the inverters NT1, NT2, and NT3 is inverted. The switches SW1 are all turned to the ON state, and the switch SW2 is turned to the OFF state. Thus, the counter circuit 1 is placed in the normal operation mode.

Figure 6B:
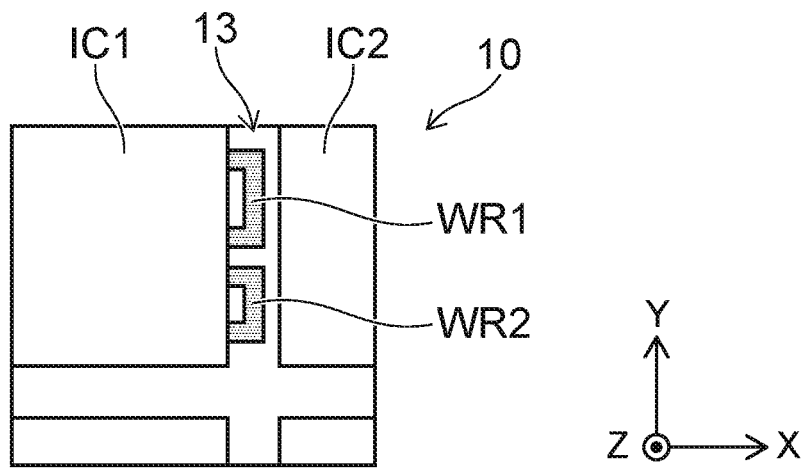
Figure 6C:
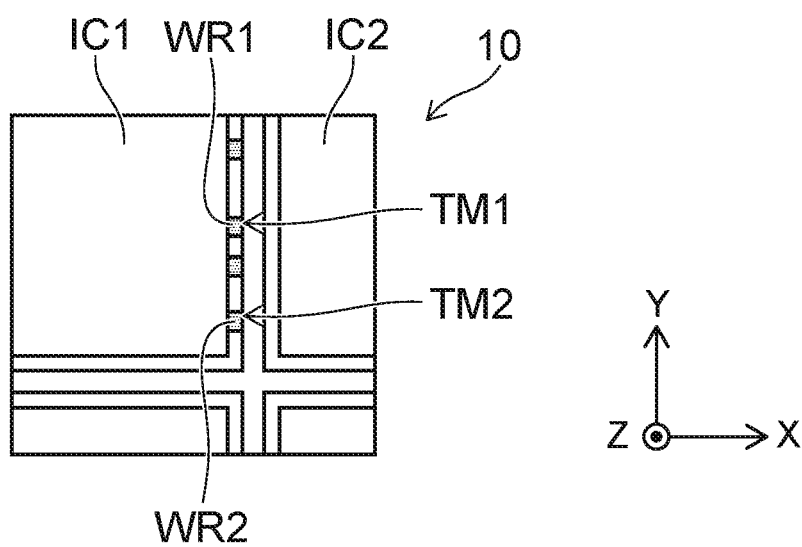

A part of the interconnect WR3 is provided in a space 13 between the integrated circuits IC as shown in e.g. FIG. 6B. Thus, without an additional step for cutting the interconnect WR3, the counter circuit 1 can be switched from the test operation mode to the normal operation mode. In this example, one counter circuit has one cutting location of the interconnect. Thus, the interconnect WR3 may be cut by e.g. a method in which the interconnect WR3 is melted by laser irradiation.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
   a substrate; and
   an integrated circuit provided on a front surface of the substrate,
   the integrated circuit including a plurality of flip-flops connected in series, a first switch, a second switch, a first interconnect, a second interconnect and a signal line,
   wherein the plurality of flip-flops includes a first flip-flop and a second flip-flop, the second flip-flop being connected to the first flip-flop through the first switch, the first interconnect being connected to the first switch, the second interconnect being connected to the second switch, the signal line being configured to supply a signal in parallel to the plurality of flip-flops through the second switch, wherein
   the first switch is maintained to be turned on by the first interconnect including a first cut portion,
   the second switch is maintained to be turned off by the second interconnect including a second cut portion, and
   the first cut portion and the second cut portion are exposed at an outer edge of the integrated circuit.

2. The device according to claim 1, further comprising:
   a logical sum gate provided between the first flip-flop and the second flip-flop, an output of the first switch and the signal being inputted to the logical sum gate, and an output of the logical sum gate being inputted to the second flip-flop.

3. The device according to claim 2, wherein
   the first switch and the logical sum gate are provided respectively in a plurality, and
   the first switch and the logical sum gate are disposed at each space between the plurality of flip-flops.

4. The device according to claim 3, wherein
   the signal line includes a first portion and a second portion, the first portion being connected to the first flip-flop at an initial stage of the plurality of flip flops and an input of the second switch, the second portion being connected to an output of the second switch and the second flip-flop at second and subsequent stages of the plurality of flip-flops through the logical sum gate, respectively.

5. The device according to claim 2, wherein the first switch and the second switch are configured so that output potential is Low of the logical sum gate when being turned off.

6. The device according to claim 2, wherein
   the first switch is configured so that gate input is High of the logical sum gate when being turned on, and
   the second switch is configured so that gate input is Low of the logical sum gate when being turned off.

7. The device according to claim 1, wherein the first switch and the second switch each include an NMOS transistor and a PMOS transistor connected in parallel.

8. A semiconductor device comprising:
   a substrate; and
   an integrated circuit provided on a front surface of the substrate,
   the integrated circuit including a plurality of flip-flops connected in series, a plurality of first switches, a second switch, a signal line and an interconnect, the interconnect being electrically connected to the plurality of first switches and the second switch, the plurality of first switches being disposed at spaces between the plurality of flip-flops, respectively, the signal line being configured to supply a signal in parallel to the plurality of flip-flops through the second switch, wherein
   the interconnect including a cut portion maintains the plurality of first switches being turned on and the second switch being turning off, and
   the cut portion is exposed at an outer edge of the integrated circuit.

9. The device according to claim 8, wherein the interconnection is connected to a common gate input of the plurality of first switches and the second switch.

* * * * *